(12) United States Patent
Wajda et al.

(10) Patent No.: US 7,393,761 B2
(45) Date of Patent: Jul. 1, 2008

(54) METHOD FOR FABRICATING A SEMICONDUCTOR DEVICE

(75) Inventors: Cory Wajda, Sand Lake, NY (US); Gert Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 11/045,124

(22) Filed: Jan. 31, 2005

(65) Prior Publication Data

US 2006/0172474 A1 Aug. 3, 2006

(51) Int. Cl.
*H01L 21/322* (2006.01)
(52) U.S. Cl. .................. 438/473; 438/476; 438/513; 438/514; 438/795; 250/423 R; 250/424
(58) Field of Classification Search .......... 438/199, 438/513, 471, 473, 476, 514, 795; 257/E29.272; 250/423 R, 424, 423 P
See application file for complete search history.

(56) References Cited

U.S. PATENT DOCUMENTS

| | | | |
|---|---|---|---|
| 6,383,880 B1 * | 5/2002 | Ngo et al. .................. 438/303 |
| 2002/0100924 A1 * | 8/2002 | Rhodes ....................... 257/256 |
| 2002/0121345 A1 * | 9/2002 | Chen et al. .............. 156/345.48 |
| 2003/0031794 A1 * | 2/2003 | Tada et al. ............ 427/255.391 |
| 2003/0042558 A1 * | 3/2003 | Noguchi et al. ............. 257/406 |
| 2004/0241968 A1 * | 12/2004 | Murakawa et al. .......... 438/513 |
| 2005/0106797 A1 * | 5/2005 | Colombo .................... 438/197 |
| 2005/0158957 A1 * | 7/2005 | Hwang et al. ............... 438/299 |
| 2005/0161434 A1 * | 7/2005 | Sugawara et al. ............. 216/67 |
| 2005/0205947 A1 * | 9/2005 | Yu et al. ..................... 257/410 |

OTHER PUBLICATIONS

Rubin, L., and Poate, J., "Ion Implantation in Silicon Technology," *The Industrial Physicist*, Jun./Jul. 2003, pp. 12-15.

Michaelides, A., Hu, P., Lee, M.-H., Alavi, A, and King, D.A., "Resolution of an Ancient Surface Science Anomaly: Work Function Change Induced by N Adsorption on W{100}," *Physical Review Letters*, Jun. 20, 2003, vol. 90, No. 24, pp. 246103-1-246103-4.

* cited by examiner

*Primary Examiner*—Hsien-ming Lee
(74) *Attorney, Agent, or Firm*—Oblon, Spivak, McClelland, Maier & Neustadt, P.C.

(57) ABSTRACT

A method for treating a gate stack in the fabrication of a semiconductor device by providing a substrate containing a gate stack having a dielectric layer formed on the substrate and a metal-containing gate electrode layer formed on the high-k dielectric layer, forming low-energy excited dopant species from a process gas in a plasma, and exposing the gate stack to the excited dopant species to incorporate a dopant into the gate stack. The method can be utilized to tune the workfunction of the gate stack.

25 Claims, 10 Drawing Sheets

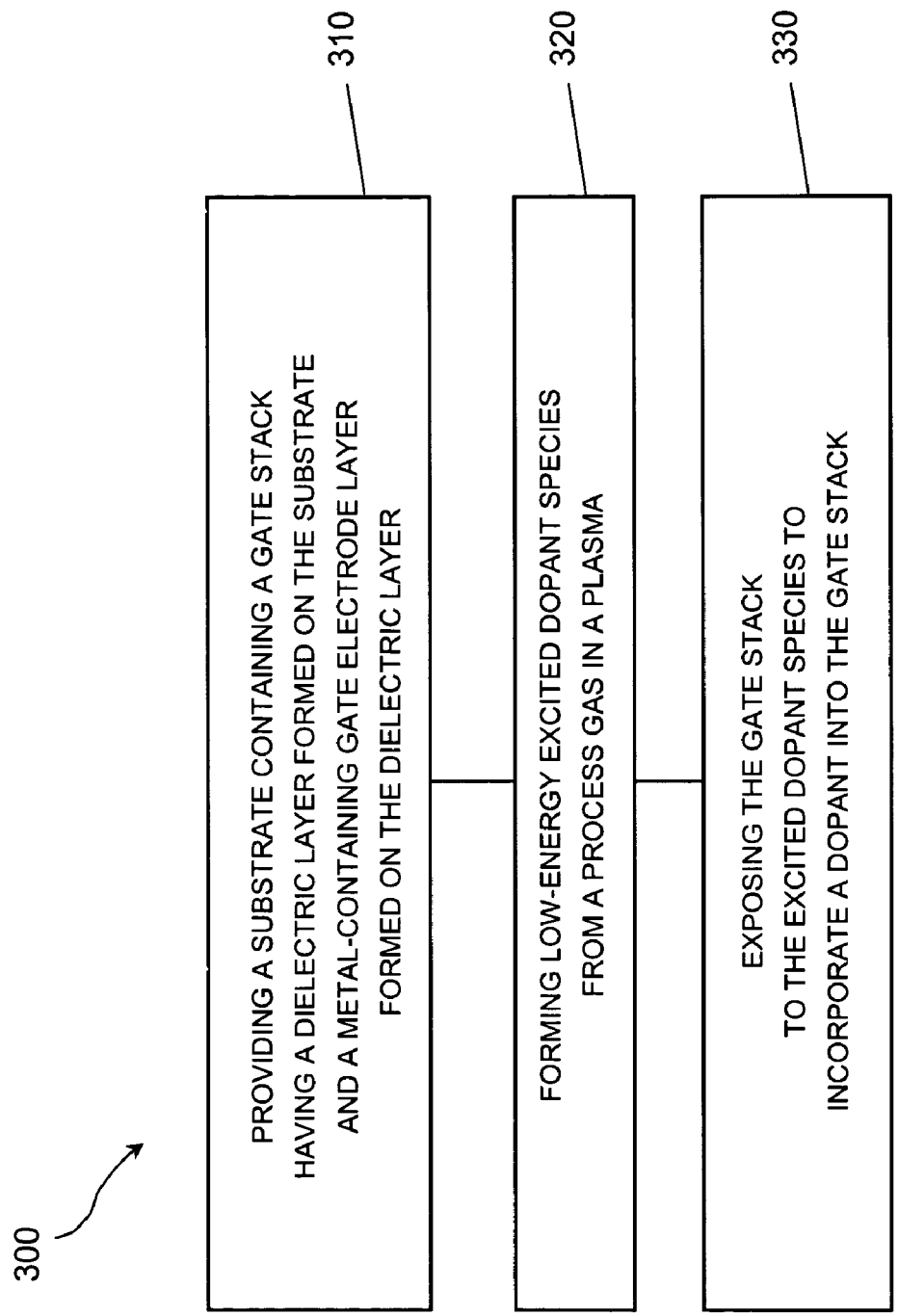

METHOD FOR FABRICATING A SEMICONDUCTOR DEVICE

FIELD OF THE INVENTION

The present invention relates to semiconductor processing, and more particularly to a method for plasma processing a gate stack to tune the workfunction of the gate stack. The gate stack contains a dielectric layer formed on a substrate and a metal-containing gate electrode layer formed on the dielectric layer.

BACKGROUND OF THE INVENTION

In the semiconductor industry, the minimum feature sizes of microelectronic devices are approaching the deep sub-micron regime to meet the demand for faster, lower power microprocessors and digital circuits. The Si-based microelectronic technology is currently faced with major materials challenges to achieve further miniaturization of integrated circuit devices. A gate stack containing a $SiO_2$ gate dielectric and a degenerately doped polycrystalline Si gate electrode, which has served the industry for several decades, will be replaced with a gate stack having a higher capacitance.

For example, high-capacitance dielectric materials may be used to replace conventional $SiO_2$ gate dielectric materials. Such high capacitance dielectric materials, known as high-k materials (where "k" refers to the dielectric constant of the material), feature a dielectric constant greater than that of $SiO_2$ (k~3.9). In addition, high-k materials may refer to dielectric materials that are deposited onto substrates (e.g., $HfO_2$, $ZrO_2$) rather than grown on the surface of the substrates (e.g., $SiO_2$, $SiO_xN_y$). High-k materials may, for example, incorporate metallic silicates or oxides (e.g., $Ta_2O_5$ (k~26), $TiO_2$ (k~80), $ZrO_2$ (k~25), $Al_2O_3$ (k~9), HfSiO (k~5–25), and $HfO_2$ (k~25)).

In addition to the gate dielectric layer, the gate electrode layer also represents a major challenge for future scaling of microelectronic devices. The introduction of metal-containing gate electrodes to replace the traditional doped poly-Si gate electrode can bring about several advantages. These advantages include elimination of the poly-Si gate depletion effect, reduction in sheet resistance, better reliability and potentially better thermal stability on the advanced high-k dielectric materials. In one example, switching from poly-Si to a metal-containing gate electrode can achieve a 2-3 Angstrom (Å) improvement in the effective or electrical thickness of the gate stack. This improvement occurs largely because the problem of poly-Si depletion at the interfaces with other materials is removed entirely.

Workfunction, resistivity, and compatibility with complementary metal oxide semiconductor (CMOS) technology are key parameters for the new gate electrode materials. The workfunction of a material is the energy required for an electron to move from the Fermi level of a material into free space. One of the material selection criteria for the metal-containing gate electrode is that the workfunction be tunable. Positive-channel Metal Oxide Semiconductor (PMOS) and the Negative-channel Metal Oxide Semiconductor (NMOS) transistor gate electrodes require different gate materials be used in order to achieve acceptable threshold voltages; the former having a Fermi level near the silicon valence band (E~4 eV), and the latter having a Fermi level near the conduction band (E~5.1 eV). TABLE 1 shows the workfunction for low, midgap, and high work function metals and metal-containing materials.

TABLE 1

| METAL | WORKFUNCTION (eV) |
|---|---|
| Al | 4.3 |
| Ti | 4.33 |
| V | 4.3 |
| Cr | 4.5 |
| Mn | 4.1 |
| Fe | 4.7 |
| Co | 5 |
| Ni | 5.15 |
| Nb | 4.3 |
| Mo | 4.6 |
| Ru | 4.7 |
| Rh | 4.98 |
| Hf | 3.9 |
| Ta | 4.25 |
| W | 4.55 |
| Re | 4.96 |
| Os | 4.83 |
| Ir | 5.27 |
| Au | 5.1 |
| TaN/TaSiN | 3.9–4.3 |

Several metal gate electrodes have been studied as a replacement for poly-Si, including Re, W, Mo, Ta, Ti, TaN, TiN and TaSiN. The metal gates must have suitable work function and required thermal and chemical stability with underlying thin gate dielectrics for gate-first CMOS processing, including high-k dielectrics such as $HfO_2$, $ZrO_2$ and their silicates. However, midgap work function metal gates are subjected to a serious problem in that the threshold voltage for the metal gate metal oxide semiconductor field emission transistor (MOSFET) is larger than that for poly-silicon gate transistor. Consequently, buried channel technology is necessary to reduce the threshold voltage of metal gate MOSFETs and that results in degradation of device characteristics including threshold voltage deviation, drive current, etc. Threshold voltage deviation becomes a more serious problem in the sub-100 nm regime because the threshold deviation is an obstacle to realize low voltage and lower power operation.

While metal gate electrode layers do not need to be doped to be electrically conductive, there is not one metal that can set the work function, the energy required to pull an electron free from the surface of the electrode, for both NMOS and PMOS devices. To replace n+ and p+ poly-Si and maintain scaled performance, it is necessary to identify pairs of metals or metal-containing materials with work functions that are close to the conduction and valence edges of Si. Mid-gap work function metals and metal-containing materials (e.g., TiN and W) are inadequate for advanced bulk-Si CMOS devices due to large low-voltage operation threshold voltages and severely degraded short channel characteristics. Control over the gate electrode workfunction can be achieved by depositing a composite metal-containing gate electrode layer, where composition of the layer can be adjusted to obtain the desired workfunction of the gate electrode.

The interactions of different materials at layer interfaces in a gate stack can affect the workfunction and other properties of the gate stack. The measured workfunction of a gate stack depends upon bulk and surface material properties, crystallographic orientation, and the permittivity of the dielectric layer interfacing with the gate electrode layer. High-energy implantation of dopant ions (e.g., nitrogen ions) into a metal gate electrode layer overlying a dielectric layer in a gate stack has been previously researched in order to lower the workfunction. However, ion implantation methods that include exposing the metal layer to high-energy ions can damage the gate stack, for example cause charging damage of the dielectric layer that can increase the leakage current and the reliability of the dielectric layer. The charging damage from exposure of high-energy ions is expected to increase as the minimum feature sizes get smaller and the different materials layers that form gate stacks get thinner. Therefore, new methods are needed for processing gate stacks and, in particular, new methods for tuning the workfunction of the gate stacks.

SUMMARY OF THE INVENTION

Accordingly, an object of the present invention is to address the above-noted and/or other problems associated with tuning the workfunction of a gate stack.

One aspect of the present invention is a method for manufacturing a semiconductor device containing a gate stack. The gate stack contains a dielectric layer formed on a substrate and a metal-containing gate electrode layer formed on the dielectric layer. The method provides for plasma processing the gate stack to modify and tune the properties of the gate stack, including the workfunction of the gate stack.

To this end, the method includes providing a substrate containing a gate stack having a dielectric layer formed on the substrate and a metal-containing gate electrode layer formed on the dielectric layer, forming low-energy excited dopant species from a process gas in a plasma, and exposing the gate electrode layer to the excited dopant species to incorporate a dopant into the gate stack.

Another aspect of the invention includes a semiconductor device having a substrate and a reduced damage gate stack. The reduced damage gate stack includes a dielectric layer formed on the substrate, a metal-containing gate electrode layer formed on the dielectric layer, and a dopant incorporated in the gate stack to provide a predetermined workfunction of said gate stack.

Still another aspect of the invention includes a system for treating a gate stack of a semiconductor device. The system includes a plasma processing chamber not having an ion beam source, and a substrate holder configured to provide a substrate containing a gate stack having a dielectric layer formed on the substrate and a metal-containing gate electrode layer formed on the dielectric layer. A plasma source is configured to form low-energy excited dopant species from a process gas in a plasma, and a biasing device configured to incorporate the dopant species into the gate stack.

BRIEF DESCRIPTION OF THE DRAWINGS

In the drawings:

FIG. 3 is a flow diagram for processing a gate stack according to an embodiment of the invention;

DETAILED DESCRIPTION OF SEVERAL EMBODIMENTS OF THE INVENTION

In the following description, in order to facilitate a thorough understanding of the invention and for purposes of explanation and not limitation, specific details are set forth, such as a particular geometry of plasma processing system and descriptions of various components. However, it should be understood that the invention may be practiced in other embodiments that depart from these specific details.

Figure 1B:
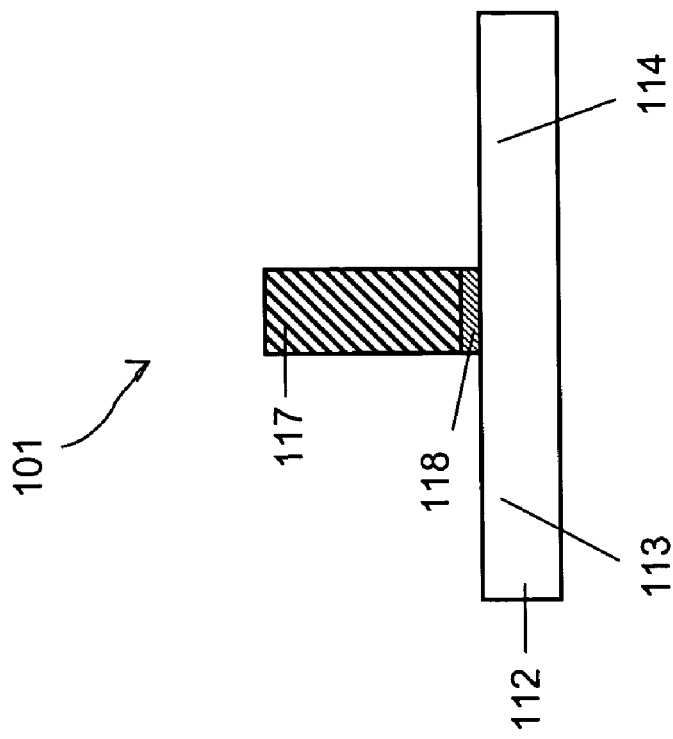
FIGS. 1A-1B schematically show cross-sectional views of gate stacks containing a metal-containing gate electrode layer and a dielectric layer according to an embodiment of the invention.
Figure 1A:
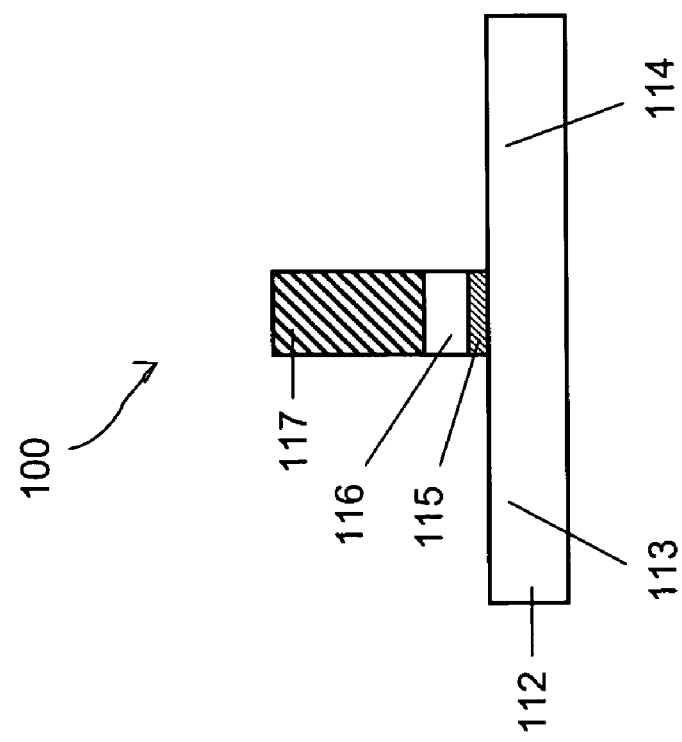

Referring now to the drawings, FIG. 1A schematically shows a cross-sectional view of a gate stack 100 containing a metal-containing gate electrode layer 117 and a high-k dielectric layer 116 according to an embodiment of the present invention. The gate stack 100 contains a substrate 112 having a source region 113 and a drain region 114, a substrate interface layer 115, a high-k dielectric layer 116 formed on the surface interface layer 115, and a metal-containing gate electrode layer 117 formed on the high-k dielectric layer 116. The substrate 112 can, for example, contain Si, Ge, Si/Ge, or GaAs. In addition the substrate 112 can contain a silicon-on-insulator (SOI) material. The insulator can, for example, be $SiO_2$. A Si substrate can be of n- or p-type, depending on the type of device being formed. The substrate (wafer) 112 can be of any size, for example a 200 mm substrate, a 300 mm substrate, or an even larger substrate.

The substrate interface layer 115 can, for example, be an oxide layer (e.g., $SiO_2$), a nitride layer (e.g., $SiN_x$), or an oxynitride layer (e.g., $SiO_xN_y$), or a combination thereof. Integrated circuits containing a Si substrate commonly employ $SiO_2$ and/or $SiO_xN_y$ substrate interface layers that can have excellent electrical properties, including high electron mobility and low electron trap densities. Gate stacks containing a high-k dielectric layer formed on $SiO_2$ and/or $SiO_xN_y$ substrate interface layers can allow the substrate interface layer 115 to have a thickness of only about 5-10 Å.

The high-k dielectric layer 116 can, for example, contain metal oxides and their silicates, including $Ta_2O_5$, $TiO_2$, $ZrO_2$, $Al_2O_3$, $Y_2O_3$, $HfSiO_x$, $HfO_2$, $ZrSiOx$, $TaSiO_x$, $SrO_x$, $SrSiO_x$, $LaO_x$, $LaSiO_x$, $YO_x$, or $YSiO_x$, or combinations of two or more thereof. The thickness of the high-k dielectric layer 116 can, for example, be between about 20 Å and about 200 Å, and can be about 40 Å. The metal-containing gate electrode layer 117 can, for example, be about 100 Å thick and can contain metals and metal-containing materials, including W, WN, Al, Mo, Ta, TaN, TaSiN, HfN, HfSiN, Ti, TiN, TiSiN, Mo, MoN, Re, or Ru.

FIG. 1B schematically shows a cross-sectional view of a gate stack 101 containing a metal-containing gate electrode layer 117 and a dielectric layer 118 according to another embodiment of the present invention. The gate stack 101 does not contain a high-k layer like the gate stack 100 in FIG. 1A and the dielectric layer 118 can contain an oxide layer, a nitride layer, or an oxynitride layer, as described above for the substrate interfacial layer 115.

The actual (measured) workfunctions of gate stacks are a function of the bulk properties of the gate electrode layer 117 and the material properties of the interfaces between the layers 117, 116, 115, and 112 in FIG. 1A, and between the layers 117, 118, and 112 in FIG. 1B. A known method for adjusting the workfunction of gate stacks, such as the ones shown in FIGS. 1A and 1B, includes modifying the surface of the dielectric layer 116 or 118 (e.g., nitrogen incorporation of $SiO_2$ to form $SiO_xN_y$) prior to depositing the gate electrode layer 117 onto the modified surface of the dielectric layer 116 or 118. Another known method for adjusting the workfunction includes ion implantation processing of the gate electrode layer 117 to incorporate dopant ions into the gate stack. Ion implantation methods commonly utilize high-energy ion beams with ion energies between about 1 keV and about 3,000 keV. Drawbacks of ion implantation methods can include charging damage to the gate stack, poor control over tuning the workfunction of the gate stack, and poor stability of the workfunction during operation of the device. These drawbacks become increasingly more important as the layers in a gate stack become thinner.

The current inventors have realized that new processing methods are needed for processing gate stacks that contain very thin layers, including a metal-containing gate electrode layer and a dielectric layer. Thus, the invention solves or minimizes the above-mention problems associated with known processing methods for tuning the workfunction of gate stacks. According to an embodiment of the invention, the workfunction of the gate stacks 100, 101 in FIGS. 1A, 1B can be modified by exposing the gate electrode layer 117 to low-energy excited dopant species to incorporate a dopant into one or more layers of the gate stacks 100 and 101. The method can incorporate dopants into very thin layers to form a gate stack with a tunable and stable workfunction while minimizing or eliminating charging damage of the device.

Figure 2A:
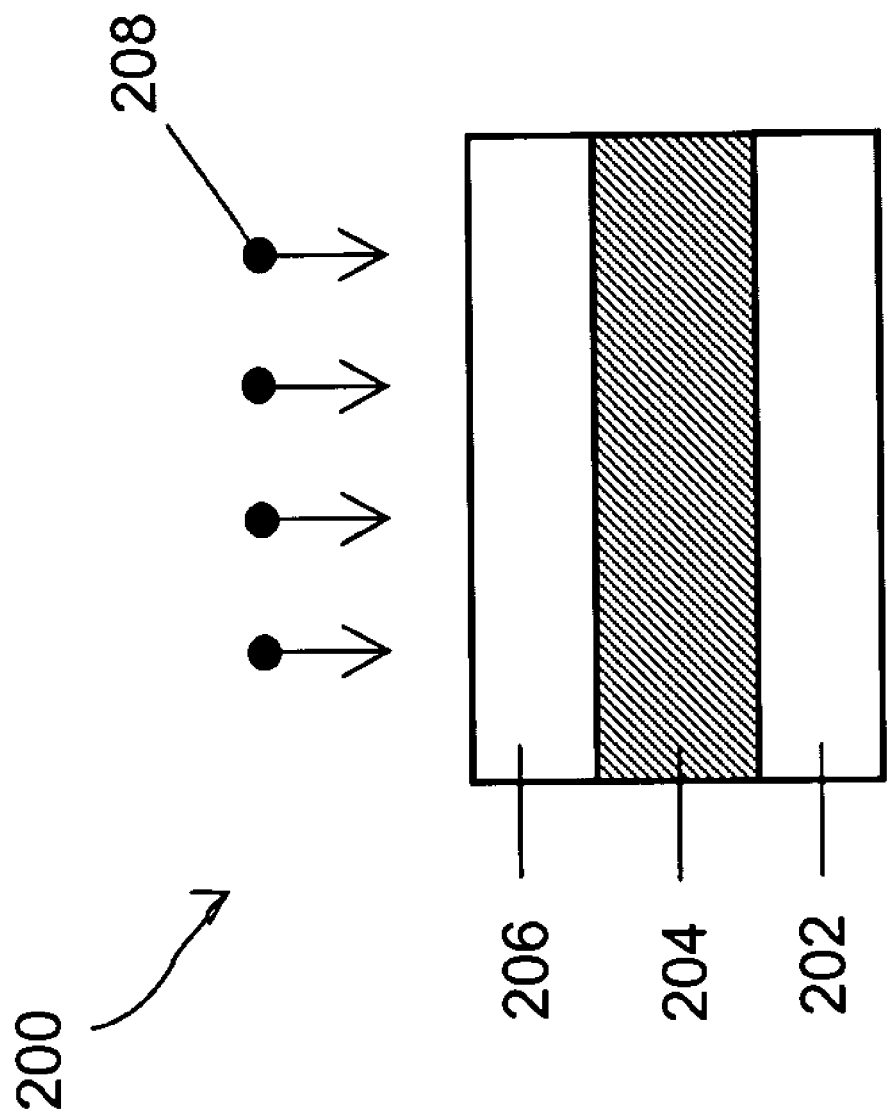
FIG. 2A schematically shows a cross-sectional view of a method for processing a gate stack according to an embodiment of the invention.

FIG. 2A schematically shows a cross-sectional view of a method for processing a gate stack according to an embodiment of the invention. The gate stack 200 contains a dielectric layer 204 formed on a substrate 202 and a metal-containing gate electrode layer 206 formed on the dielectric layer 204. The thickness of the gate electrode layer 206 can be less that about 500 Å or alternately less than about 150 Å. According to one embodiment of the invention, the dielectric layer 204 can be a high-k dielectric layer. The gate stack 200 can further contain a thin substrate interface layer (not shown) located under the dielectric layer 204 (see layer 115 in FIG. 1A). According to embodiments of the invention, the gate electrode layer 206 is exposed to low-energy excited dopant species 208 in order to incorporate a dopant into one or more of the layers of the gate stack 200. The excited dopant species formed from a process gas in a plasma can include radicals, ions, or a combination thereof.

The plasma conditions and exposure times can be selected such that a desired amount of a dopant is incorporated into at least one layer of the gate stack 200, thereby tuning the workfunction of the gate stack 200 and improving the thermal and electrical properties of the gate stack 200. Plasma condition parameters can include concentration of excited dopant species, kinetic energy of the excited dopant species when they interact with the substrate. The latter can, for example, be selected through biasing of the substrate. According to an embodiment of the invention, the kinetic energy of the excited dopant species can be less than about 1000 eV. Alternately, the kinetic energy can be less than about 100 eV. Yet alternately, the kinetic energy can be less than about 2 eV. Furthermore, embodiments of the invention can include an annealing step for annealing the gate stack following the exposure to the excited dopant species. The annealing step can be performed to obtain the desired dopant depth profile (dopant concentration as a function of depth in the gate stack), workfunction, and material and electrical properties of the gate stack. The annealing can be performed by maintaining the gate stack at a temperature between about 200° C. and about 1000° C., more preferably between about 700° C. and about 1000° C., or higher, for example.

According to an embodiment of the invention, the low-energy excited dopant species 208 can be formed from a process gas containing a nitrogen-containing gas (e.g., $N_2$, $NH_3$), a phosphor-containing gas (e.g., $PH_3$), an arsenic-containing gas (e.g., $AsH_3$), a carbon-containing gas (e.g., $CH_4$), a silicon-containing gas (e.g., $SiH_4$, $Si_2H_6$), a germanium-containing gas (e.g., $GeH_4$), or a boron-containing gas (e.g., $B_2H_6$), or a combination of two or more thereof. Thus, the dopants incorporated into the gate stack 200 can include non-metallic elements N, C, Si, Ge, or B, or a combination of two or more thereof. According to another embodiment of the invention, the process gas can contain a metal-containing gas, for example an antimony-containing gas (e.g., $SbH_3$), a titanium-containing gas (e.g., $TiCl_4$), a tantalum-containing gas (e.g., $TaCl_5$), or an aluminum-containing gas (e.g., $Al_2Cl_6$), or a combination of two or more thereof. Thus, the dopant incorporated into the gate stack 200 can include a metal atom such as Sb, Ti, Ta, or Al. Some of these dopants are commonly classified as p-type, for example B and Al, or n-type, for example N, P, As, and Sb. The invention is not limited to the above-mentioned non-metallic and metallic elements, as other elements may be used without departing from the scope of the invention.

Figure 2D:
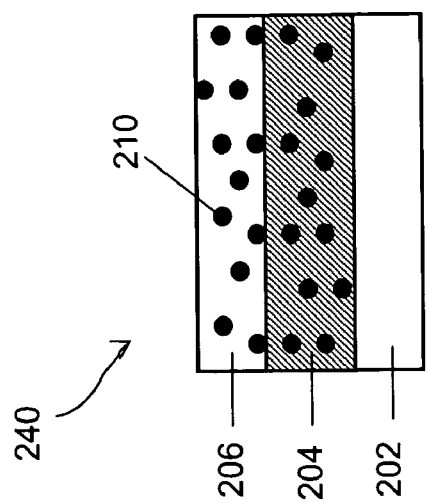
FIGS. 2B-2D schematically show simplified cross-sectional views of gate stacks processed according to embodiments of the invention.
Figure 2B:
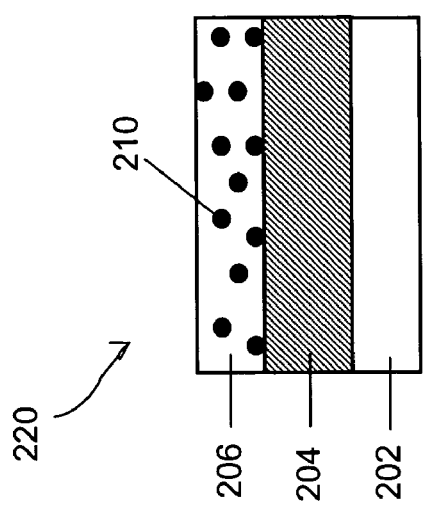
Figure 2C:
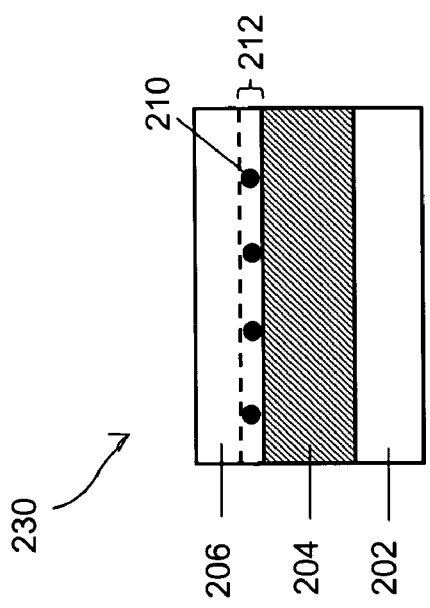

FIGS. 2B-2D schematically show simplified cross-sectional views of gate stacks processed according to embodiments of the invention. The metal-containing gate electrode layers in the gate stacks depicted in FIGS. 2B-2D were exposed to low-energy excited dopant species to incorporate a dopant 210 into the gate stacks 220, 230, and 240. The depth profile of the dopant 210 in the gate stacks 220, 230, and 240 in FIGS. 2B-2D can, for example, be adjusted by selecting the plasma processing conditions and the annealing conditions.

FIG. 2B schematically shows a simplified cross-sectional view of a gate stack 220 according to an embodiment of the invention. The gate stack 220 contains a dopant 210 incorporated into the metal-containing gate electrode layer 206 by exposure to low-energy excited dopant species. The concentration of the dopant 210 in the gate electrode layer 206 can be substantially uniform throughout the gate electrode layer 206 as schematically shown, or alternately, the concentration of the dopant 210 can be non-uniform throughout the gate electrode layer 206.

FIG. 2C schematically shows a simplified cross-sectional view of a gate stack 230 according to another embodiment of the invention. FIG. 2C shows an example of non-uniform concentration of the dopant 210 in the gate electrode layer 206. In this example, the dopant 210 is located in a sub-layer 212 of the gate electrode layer 206, near the interface of the gate electrode layer 206 and the dielectric layer 204. The non-uniform concentration of the dopant 210 in the gate electrode layer 206 can, for example, be achieved by annealing the substrate, thereby enhancing diffusion of the dopant 210 to the interface.

In the exemplary gate stacks shown in FIGS. 2B and 2C, the dopant 210 is incorporated into the gate electrode layer 206 but not into the dielectric layer 204. In one example, the dielectric layer 204 can be exposed to nitrogen species, prior to depositing the gate electrode layer 206 on the dielectric layer 204 and prior to exposing the gate electrode layer to the excited dopant species according to embodiments to the invention, to reduce or eliminate incorporation of the dopant 10 into the dielectric layer 204.

FIG. 2D schematically shows a simplified cross-sectional view of a gate stack 240 according to another embodiment of the invention. In FIG. 2D, the concentration of the dopant 210 is substantially uniform throughout the gate electrode layer 206 and the dielectric layer 204.

As one skilled in the art will appreciate, the invention is not limited to the dopant depth profiles schematically shown in FIGS. 2B-2D as other dopant profiles are contemplated. For example, dopant depth profiles that exhibit gradual changes in dopant concentration throughout one or more of the layers shown in FIGS. 2B-2D are contemplated.

In addition, the gate stacks of FIGS. 2B-2D can have reduced damage when produced in accordance with the present invention. As used herein, "reduced damage" means less physical damage including fewer dangling bonds and trapped charges, than a gate stack doped using ion implantation at energies of 1 keV or more. Such reduced damage is quantifiable by one of ordinary skill in the art by visual and/or electrical characteristics inspection. For example, visual inspection may be done by scanning electron microscope (SEM), and electrical characteristic inspection may be done by testing breakdown voltage, leakage current, and capacitance voltage properties of the device.

FIG. 3 is a flow diagram for processing a gate stack according to an embodiment of the invention. The process 300 includes in step 310, providing in a plasma processing system a substrate containing a gate stack having a dielectric layer formed on the substrate and a metal-containing gate electrode layer formed on the dielectric layer. In step 320, low-energy excited dopant species are formed from a process gas in a plasma. The plasma can, for example, be formed in any of the plasma processing systems described in FIGS. 4-8. The plasma processing system can contain a capacitively coupled plasma source, an inductively coupled plasma source, a remote plasma source, a slot plane antenna plasma source, an ultra-violet radiation plasma source, or a plasma source containing a magnetic field system, or a combination thereof.

In step 330, the gate electrode layer is exposed to the excited dopant species to incorporate a dopant into the gate stack. The exposure is performed under predetermined processing conditions for a time period that results in a desired amount of the dopant incorporated into the gate stack. A process recipe for incorporating a desired amount of a dopant into a gate stack can be determined by direct experimentation and/or design of experiments (DOE). After processing the gate stack according to embodiments of the invention, electrical properties of the gate stack (e.g., the workfunction) can be measured. In addition, the depth profile of the dopant and other materials in the gate stack can be measured, for example by secondary ion mass spectroscopy (SIMS). Following these measurements the process parameters may be adjusted if needed to achieve the desired dopant incorporation. As one skilled in the art will readily appreciate, adjustable process parameters include plasma conditions (plasma power, process pressure, and process gas composition), process time, and substrate temperature.

The process 300 may further contain an annealing step for annealing the gate stack following the exposure to excited dopant species. The annealing step can be performed to obtain the desired dopant depth profile, workfunction, and material and electrical properties of the gate stack.

As would be appreciated by those skilled in the art, each of the steps or stages in the flowchart of FIG. 3 may encompass one or more separate steps and/or operations. Accordingly, the recitation of only three steps in 310, 320, 330 should not be understood to limit the method of the present invention solely to three steps or stages. Moreover, each representative step or stage 310, 320, 330 should not be understood to be limited to only a single process.

Figure 4:
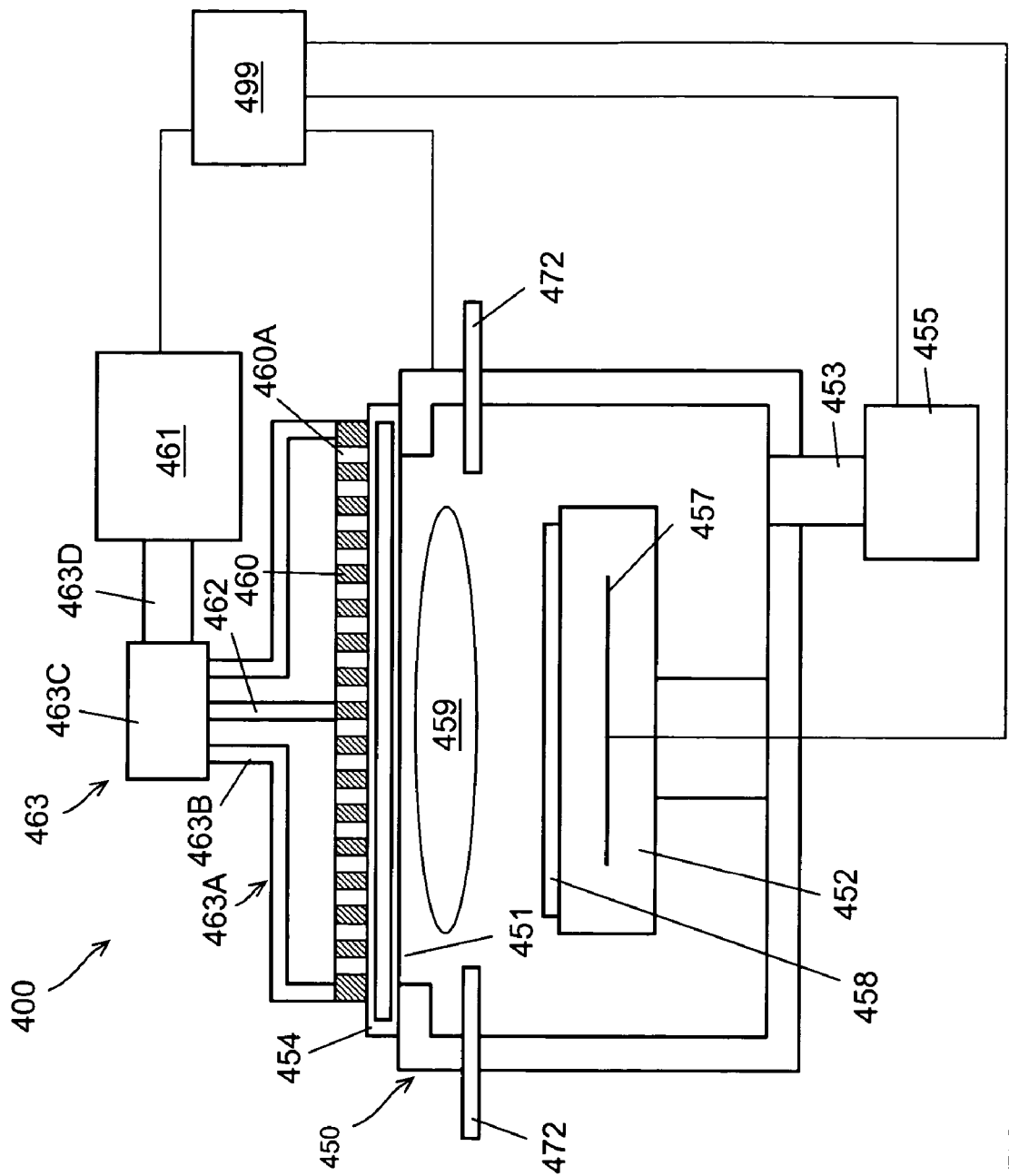
FIGS. 4-8 shown plasma processing systems for processing a gate stack according to embodiments of the invention.

FIG. 4 is a simplified block-diagram of a plasma processing system containing a slot plane antenna (SPA) plasma source for processing a gate stack according to an embodiment of the invention. The plasma produced in the plasma processing system 400 is characterized by low electron temperature (less than about 1.5 eV) and high plasma density ($>1\times10^{12}/cm^3$), that enables damage-free (or reduced damage) processing of gate stacks according to the invention. The plasma processing system 400 can, for example, be a TRIAS™ SPA processing system from Tokyo Electron Limited, Akasaka, Japan. The plasma processing system 400 contains a process chamber 450 having an opening portion 451 in the upper portion of the process chamber 450 that is larger than a substrate 458. A cylindrical dielectric top plate 454 made of quartz or aluminum nitride is provided to cover the opening portion 451. Gas lines 472 are located in the side wall of the upper portion of process chamber 450 below the top plate 454. In one example, the number of gas lines 472 can be 16 (only two are which are shown in FIG. 4). Alternately, a different number of gas feed lines 472 can be used. The gas lines 472 can be circumferentially arranged in the process chamber 450, but this is not required for the invention. A process gas can be evenly and uniformly supplied into the plasma region 459 in process chamber 450 from the gas lines 472.

In the plasma processing system 450, microwave power is provided to the process chamber 450 through the top plate 454 via a plane antenna member 460 having a plurality of slots 460A. The slot plane antenna 460 can be made from a metal plate, for example copper. In order to supply the microwave power to the slot plane antenna 460, a waveguide 463 is disposed on the top plate 454, where the waveguide 463 is connected to a microwave power supply 461 for generating microwaves with a frequency of 2.45 GHz, for example. The waveguide 463 contains a flat circular waveguide 463A with a lower end connected to the slot plane antenna 460, a circular waveguide 463B connected to the upper surface side of the circular waveguide 463A, and a coaxial waveguide converter 463C connected to the upper surface side of the circular waveguide 463B. Furthermore, a rectangular waveguide 463D is connected to the side surface of the coaxial waveguide converter 463C and the microwave power supply 461.

Inside the circular waveguide 463B, an axial portion 462 of an electroconductive material is coaxially provided, so that one end of the axial portion 462 is connected to the central (or nearly central) portion of the upper surface of slot plane antenna 460, and the other end of the axial portion 462 is connected to the upper surface of the circular waveguide 463B, thereby forming a coaxial structure. As a result, the circular waveguide 463B is constituted so as to function as a coaxial waveguide. The microwave power can, for example, be between about 0.5 W/cm² and about 4 W/cm². Alternately, the microwave power can be between about 0.5 W/cm² and about 3 W/cm².

In addition, in the vacuum process chamber 450, a substrate holder 452 is provided opposite the top plate 454 for supporting and heating a substrate 458 (e.g., a wafer). The substrate holder 452 contains a heater 457 to heat the substrate 458, where the heater 457 can be a resistive heater. Alternately, the heater 457 may be a lamp heater or any other type of heater. Furthermore the process chamber 450 contains an exhaust line 453 connected to the bottom portion of the process chamber 450 and to a vacuum pump 455.

Still referring to FIG. 4, a controller 499 includes a microprocessor, a memory, and a digital I/O port capable of generating control voltages sufficient to communicate and activate inputs of the plasma processing system 400 as well as monitor outputs from the plasma processing system 400. Moreover, the controller 499 is coupled to and exchanges information with process chamber 450, the pump 455, the heater 457, and the microwave power supply 461. A program stored in the memory is utilized to control the aforementioned components of plasma processing system 400 according to a stored process recipe. One example of processing system controller 499 is a UNIX-based workstation. Alternately, the controller 499 can be implemented as a general-purpose computer, digital signal processing system, etc.

The controller 499 may be locally located relative to the plasma processing system 400 or it may be remotely located relative to the plasma processing system 400 via an internet or intranet. Thus, the controller 499 can exchange data with the plasma processing system 400 using at least one of a direct connection, an intranet, or the internet. The controller 499 may be coupled to an intranet at a customer site (i.e., a device maker, etc.), or coupled to an intranet at a vendor site (i.e., an equipment manufacturer). Furthermore, another computer (i.e., controller, server, etc.) can access the controller 499 to exchange data via at least one of a direct connection, an intranet, or the internet.

Further details of a plasma processing system containing a slot plane antenna plasma source and methods of using are described in copending European Patent Application EP1361605A1, titled "METHOD FOR PRODUCING MATERIAL OF ELECTRONIC DEVICE.", the entire contents of which is hereby incorporated by reference.

Figure 5:
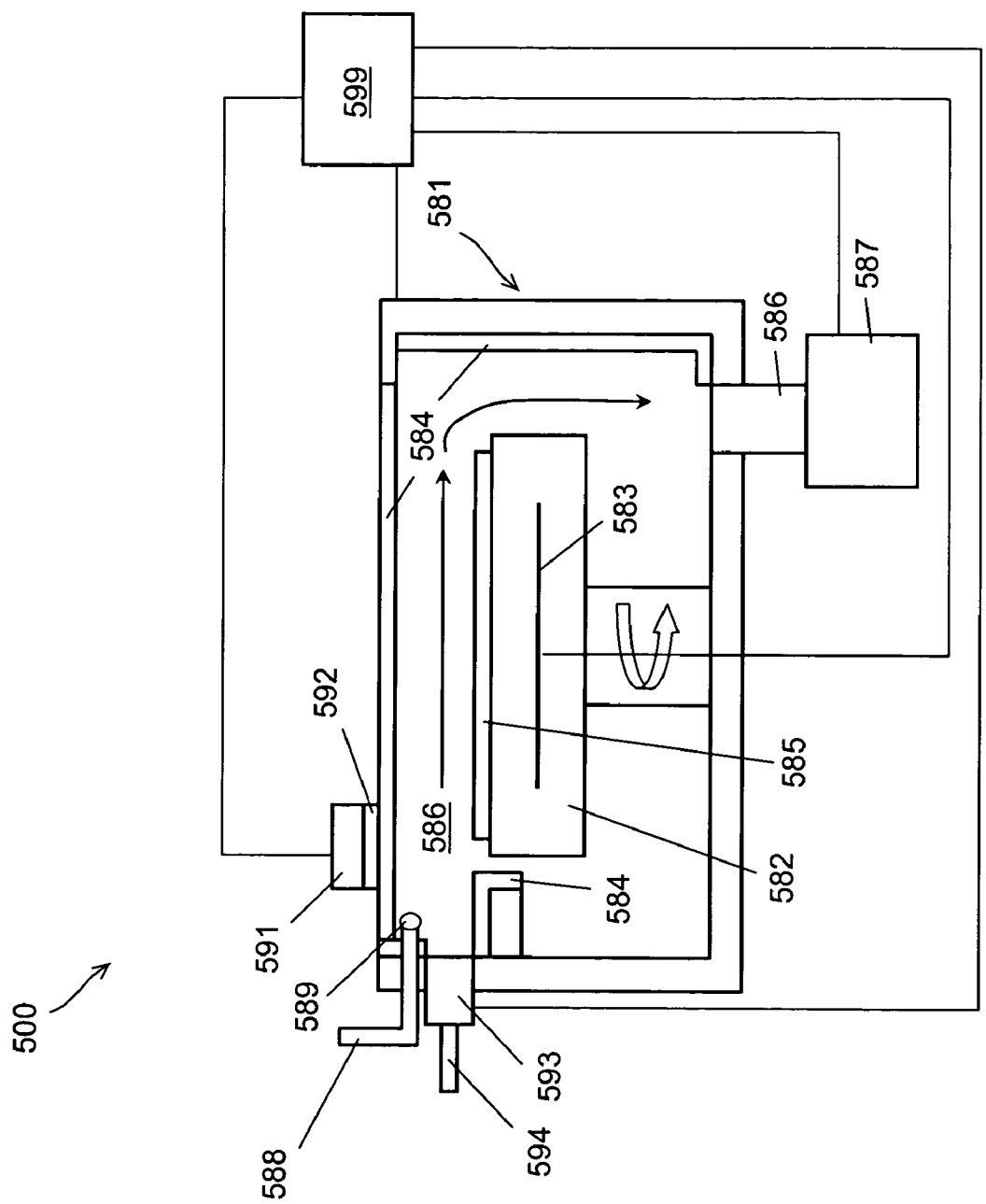

FIG. 5 is a simplified block-diagram of a plasma processing system containing an ultra-violet (UV) radiation plasma source and a remote plasma source for processing a gate stack according to embodiments of the invention. The plasma processing system 500 includes a process chamber 581 accommodating therein a substrate holder 582 equipped with a heater 583 that can be a resistive heater. Alternately, the heater 583 may be a lamp heater or any other type of heater. Furthermore the process chamber 581 contains an exhaust line 586 connected to the bottom portion of the process chamber 581 and to a vacuum pump 587. The substrate holder 582 can be rotated by a drive mechanism (not shown). The process chamber 581 contains a process space 586 above the substrate 585. The inner surface of the process chamber 581 contains an inner liner 584 made of quartz in order to suppress metal contamination of the substrate 585 to be processed.

The process chamber 581 contains a gas line 588 with a nozzle 589 located opposite the exhaust line 586 for flowing a process gas over the substrate 585. The process gas flows over the substrate 585 in a processing space 586 and is evacuated from the process chamber 581 by the exhaust line 586.

The process gas supplied from the nozzle 589 can be activated in a plasma generated by an ultra-violet radiation plasma source 591 emitting light through a quartz window 592 into the processing space 586 between the nozzle 589 and the substrate 585. The plasma forms low-energy excited dopant species in the processing space 586 that flow along the surface of the substrate 585, thereby exposing the substrate 585 to the excited dopant species.

Furthermore, the process chamber 581 contains a remote plasma source 593 located opposite the exhaust line 586. A process gas can be supplied by gas line 594 to a remote plasma source 593 for forming low-energy excited dopant species. The excited dopant species flow from the remote plasma source 593 along the surface of the substrate 585, thereby exposing the substrate to the excited dopant species.

According to embodiments of the invention, the substrate 585 may be exposed to excited dopant species generated by the ultraviolet radiation plasma source 591, the remote plasma source 593, or both.

Still referring to FIG. 5, a controller 599 includes a microprocessor, a memory, and a digital I/O port capable of generating control voltages sufficient to communicate and activate inputs of the plasma processing system 500 as well as monitor outputs from the plasma processing system 500. Moreover, the controller 599 is coupled to and exchanges information with process chamber 581, the pump 587, the heater 583, the remote plasma source 593, and the ultra-violet radiation plasma source 591. As with the controller 499 in FIG. 4, the controller 599 may be implemented as a UNIX-based workstation. Alternately, the controller 599 can be implemented as a general-purpose computer, digital signal processing system, etc.

Further details of a plasma processing system containing an ultra-violet (UV) radiation plasma source and a remote plasma source is described in copending European Patent Application EP1453083A1, titled "NITRIDING METHOD FOR INSULATION FILM, SEMICONDUCTOR DEVICE AND PRODUCTION METHOD FOR SEMICONDUCTOR DEVICE, SUBSTRATE TREATING DEVICE AND SUBSTRATE TREATING METHOD", the entire contents of which is hereby incorporated by reference.

According to an embodiment of the invention, the plasma processing systems 500 in FIG. 5, can utilize a process gas containing a nitrogen-containing gas (e.g., $N_2$, $NH_3$) having a gas flow rate between about 2 standard cubic centimeters per minute (sccm) and about 500 sccm. Alternately, the nitrogen-containing gas flow rate can be between about 4 sccm and about 200 sccm. Furthermore, the process gas can contain an inert gas such as a noble gas (e.g., Ar, He, Kr, etc) with a gas flow rate between about 200 sccm and about 5000 sccm. The addition of Ar gas to the nitrogen-containing gas has been found to increase the lifetime of excited nitrogen species in the process chamber 581, thereby allowing for increasing the concentration of nitrogen radicals above the surface of the substrate 585. Alternately, the inert gas flow rate can be between 500 sccm and about 2000 sccm. Yet alternately, the inert gas flow rate can be between about 1000 sccm and about 2000 sccm. In addition, the process gas can contain $H_2$ gas with a gas flow rate between about 1 sccm and about 100 sccm. Alternately, the $H_2$ gas flow rate can be between about 2 sccm and about 50 sccm. Yet alternately, the $H_2$ gas flow rate can be between about 5 sccm and about 30 sccm.

The processing conditions can further include a substrate temperature between about 0° C. and about 1000° C. Alternately, the substrate temperature can be between about 200° C. and about 700° C. The pressure in the processing chambers 450 and 581 can, for example, be maintained between about 10 mTorr and about 3000 mTorr. Alternatively, the pressure can be maintained between about 20 mTorr and about 1000 mTorr. Yet alternately, the pressure can be maintained between about 50 mTorr and about 500 mTorr.

According to an embodiment of the invention, plasma processing system 400 or plasma processing system 500 of FIGS. 4 and 5, respectively, can be utilized to form the substrate interface layer 115 shown in FIG. 1A.

Figure 6:
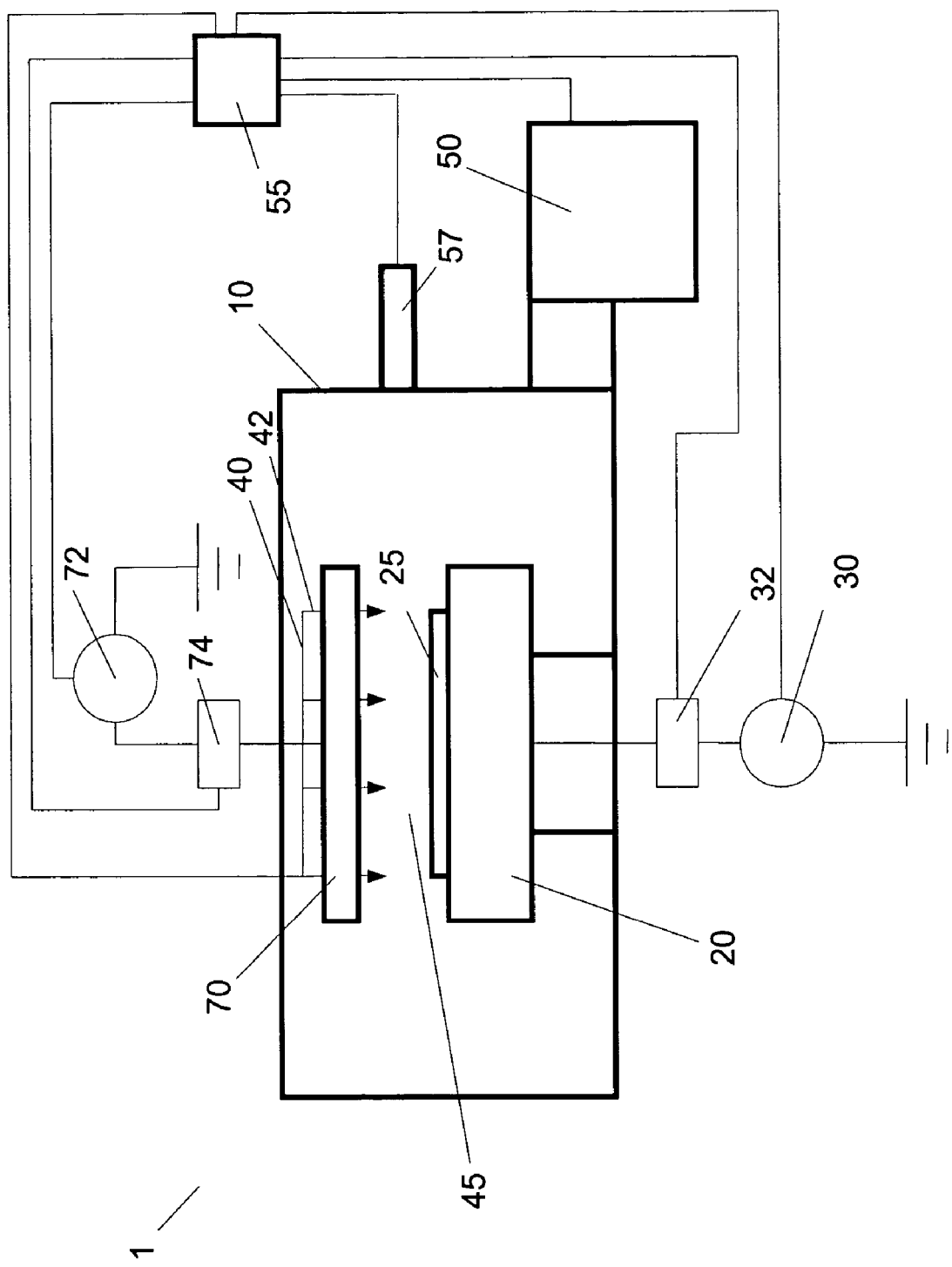

FIG. 6 shows a plasma processing system according to an embodiment of the invention. The plasma processing system 1 is configured to facilitate the generation of plasma in processing region 45 of the process chamber 10. The plasma processing system 1 further comprises a substrate holder 20, upon which a substrate 25 to be processed is affixed and makes electrical contact to, and a gas injection system 40 for introducing process gas 42 to the plasma process chamber 10, and a vacuum pumping system 50. The gas injection system 40 allows independent control over the delivery of the process gas 42 to the process chamber 10 from ex-situ gas sources.

An ionizable process gas 42 is introduced via the gas injection system 40 and the process pressure is adjusted. The flow rate of the process gas can be between about 10 sccm and about 5000 sccm, alternately between about 20 sccm and about 1000 sccm, and still alternately between about 50 sccm and about 500 sccm. The chamber pressure can, for example, be between about 1 mTorr and about 200 mTorr, alternately between about 5 mTorr and about 100 mTorr, still alternately between about 10 mTorr and about 50 mTorr. The controller 55 can be used to control the vacuum pumping system 50 and gas injection system 40. Substrate 25 is transferred into process chamber 10 through a slot valve (not shown) and chamber feed-through (not shown) via a (robotic) substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers are included in the substrate holder 20.

The plasma processing system 1 of FIG. 6 includes a RF plasma source that contains an upper plate electrode 70 to which RF power is coupled from a RF generator 72 through an impedance match network 74. A typical frequency for the application of RF power to the upper plate electrode 70 can range from 10 MHz to 200 MHz and can be 60 MHz. The RF power applied to the upper plate electrode 70 can be between about 500 Watts (W) and about 2200W. As noted above, the plasma processing system 1 of FIG. 6 further includes a RF source for applying RF power to the substrate holder 20 to bias the substrate 25. As described above, the bias can be utilized to control the kinetic energy of the excited dopant species as they interact with the substrate 25. The RF source contains a RF generator 30 and an impedance match network 32 that serves to maximize the transfer of RF power to plasma to the processing region 45 by minimizing the reflected power. Match network topologies (e.g., L-type, π-type, T-type) and automatic control methods are known in the art. A typical frequency for the application of power to the substrate holder 20 ranges from 0.1 MHz to 30 MHz and can be 2 MHz. The RF power applied to the substrate holder 20 can be between about 0 W and about 1000 W. Moreover, the controller 55 is coupled to the RF generator 72 and the impedance match network 74 in order to control the application of RF power to the upper plate electrode 70. In an alternate embodiment, RF power can be applied to the substrate holder 20 at multiple frequencies.

With continuing reference to FIG. 6, the process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate. In one embodiment, the multi-orifice showerhead gas injection plate can be the upper plate electrode 70.

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for dry plasma etch, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the RF generator 72, the impedance match network 74, the gas injection system 40, plasma monitor system 57, and the vacuum pump system 50. A program stored in the memory is utilized to control the aforementioned components of a plasma processing system 1 according to a stored process recipe. One example of controller 55 is a digital signal processor (DSP); model number TMS320, available from Texas Instruments, Dallas, Tex.

The plasma monitor system 57 can comprise, for example, an optical emission spectroscopy (OES) system to measure excited particles in the plasma environment and/or a plasma diagnostic system, such as a Langmuir probe, for measuring plasma density. The plasma monitor system 57 can be used with controller 55 to determine the status of the etching process and provide feedback to ensure process compliance. Alternately, plasma monitor system 57 can comprise a microwave and/or a RF diagnostic system.

Figure 7:
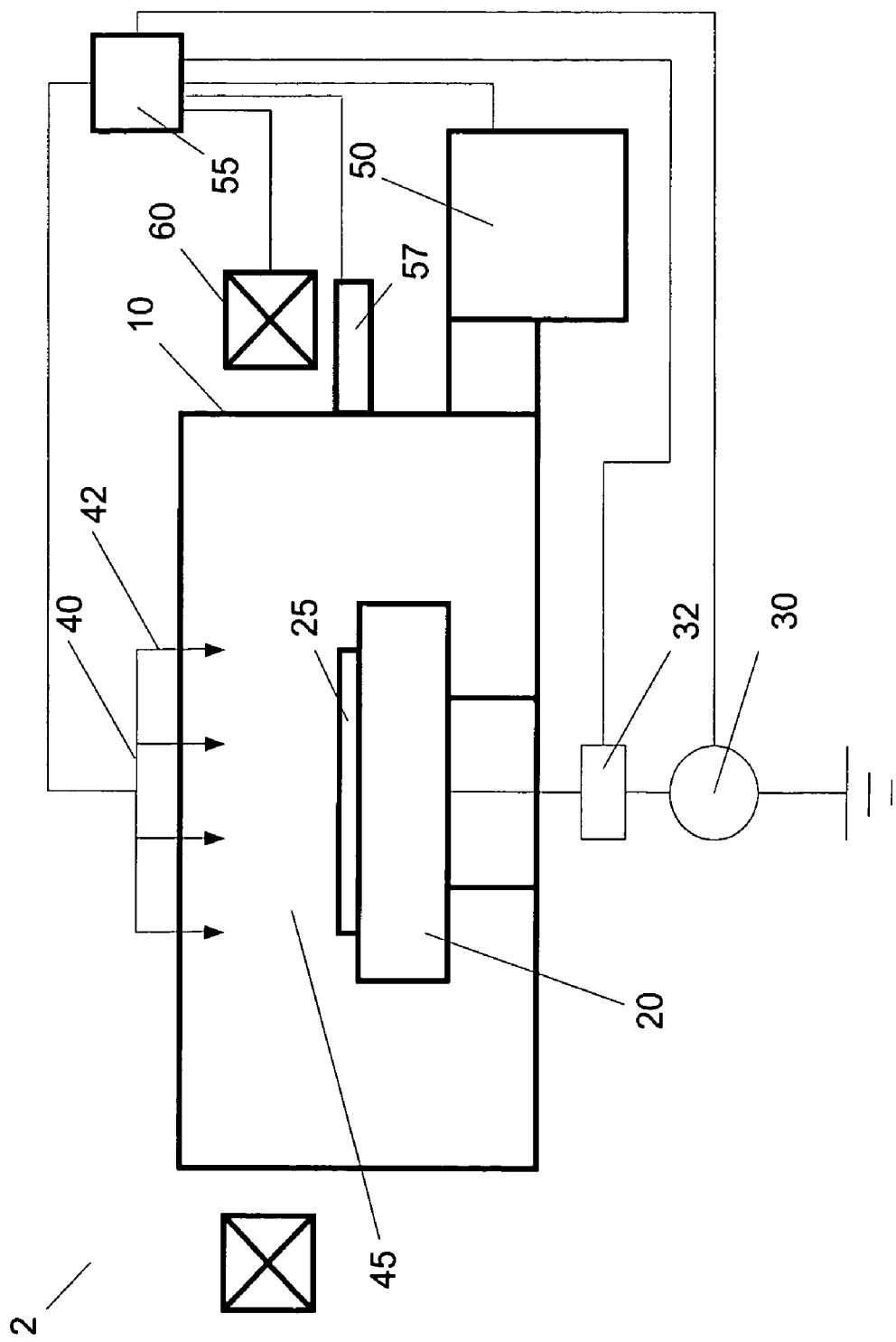

FIG. 7 shows a plasma processing system according to another embodiment of the present invention. The plasma processing system 2 includes a RF plasma source comprising either a mechanically or electrically rotating DC magnetic field system 60, in order to potentially increase plasma density and/or improve plasma processing uniformity. Moreover, the controller 55 is coupled to the rotating magnetic field system 60 in order to regulate the speed of rotation and field strength.

Figure 8:
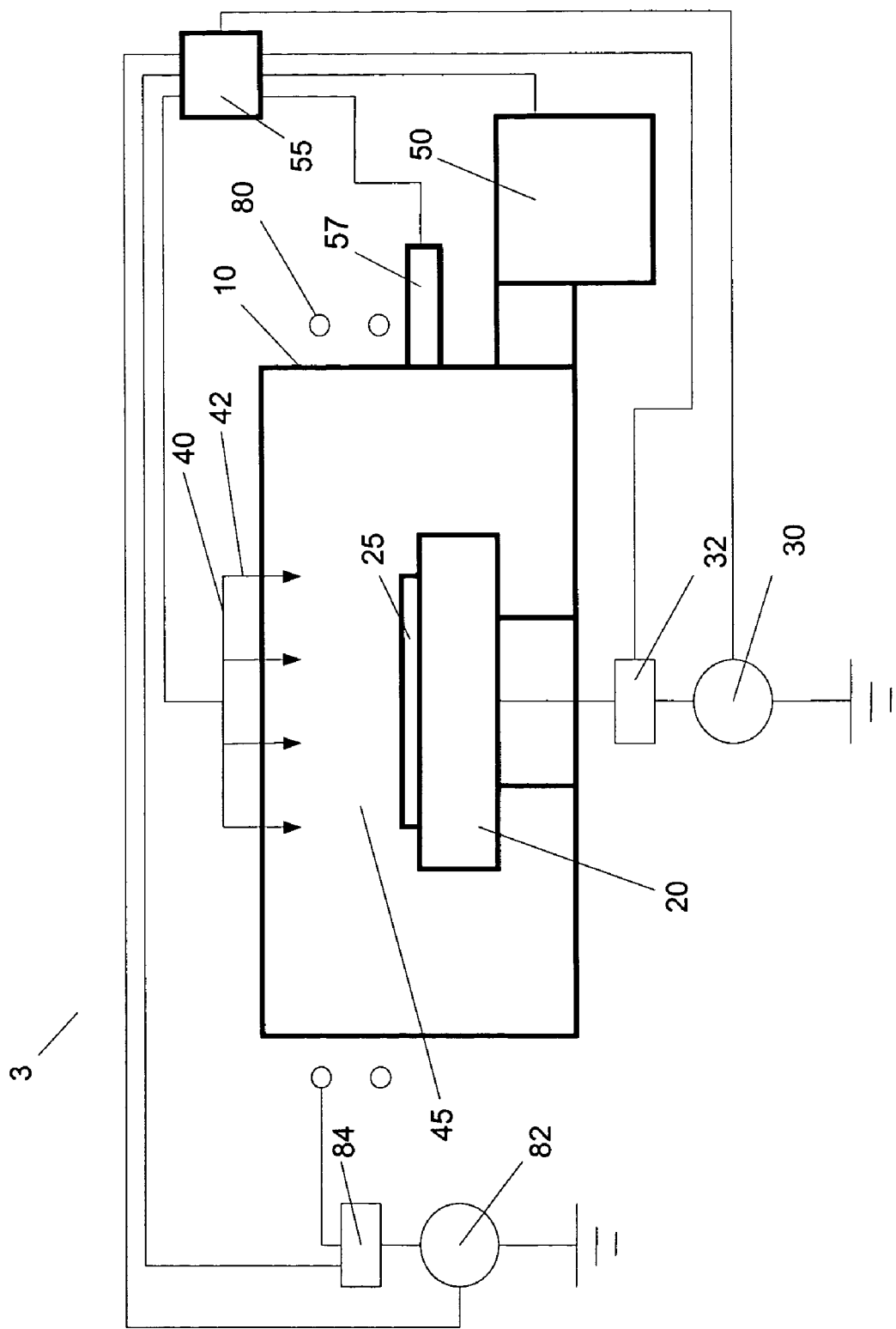

FIG. 8 shows a plasma processing system according to yet another embodiment of the present invention. The plasma processing system 3 includes a RF plasma source comprising an inductive coil 80 to which RF power is coupled via a RF generator 82 through an impedance match network 84. RF power is inductively coupled from the inductive coil 80 through a dielectric window (not shown) to the plasma-processing region 45. A typical frequency for the application of RF power to the inductive coil 80 ranges from 0.1 MHz to 100 MHz and can be 13.56 MHz. The RF power applied to the inductive coil can be between about 50 W and about 10000 W. Similarly, a typical frequency for the application of power to the chuck electrode ranges from 0.1 MHz to 30 MHz and can be 13.56 MHz. The RF power applied to the substrate holder can be between about 0 W and about 1000 W. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

Figure 9:
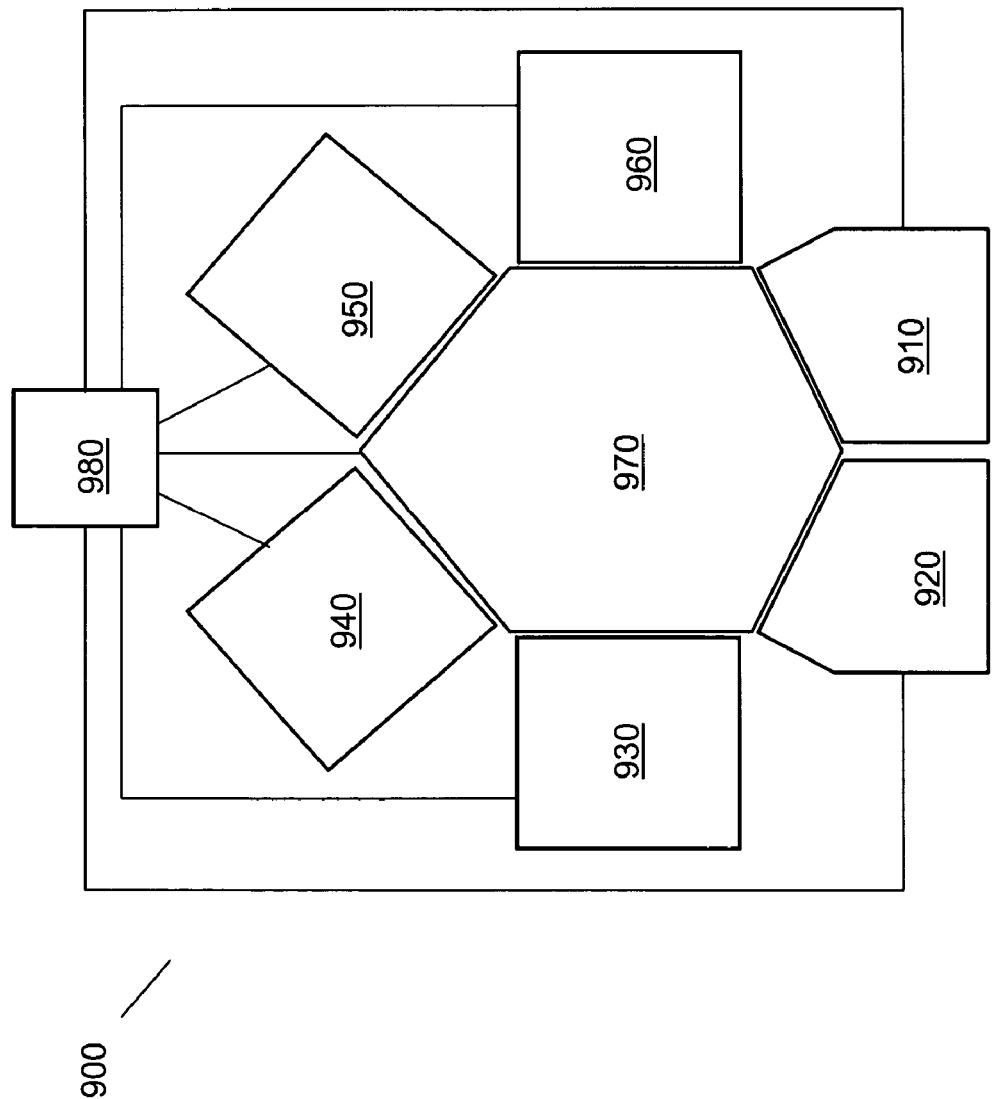
FIG. 9 is a simplified block diagram of a processing tool for processing a gate stack according to an embodiment of the invention.

In addition, it is to be understood that the plasma processing systems depicted in FIGS. 4-8 are shown for exemplary purposes only, as many variations of the specific hardware can be used to implement plasma processing systems in which the present invention may be practiced, and these variations will be readily apparent to one having ordinary skill in the art.

FIG. 9 is a simplified block diagram of a processing tool for processing a gate stack according to an embodiment of the invention. The processing tool 900 contains substrate loading chambers 910 and 920, processing systems 930-960, a robotic transfer system 970 for transferring substrates within the processing tool 900, and a controller 980 for controlling the processing tool 900. In one example, processing system 930 can be utilized for cleaning a substrate to be processed, processing system 940 can be utilized to deposit a dielectric layer (e.g., a high-k layer) on a substrate, processing system 950 can be utilized to deposit a metal-containing gate electrode layer on the dielectric layer, and processing system 960 can be one of the plasma processing systems shown in FIGS. 4-8 for exposing the gate electrode layer to low-energy excited dopant species to incorporate a dopant into the gate stack. The processing tool 900 can be controlled by a controller 980. The controller 980 can be coupled to and exchange information with substrate loading chambers 910 and 920, processing systems 930-960, and robotic transfer system 970.

As described above, the multiple processing systems shown in FIG. 9 can be utilized to perform different steps of manufacturing a gate stack, including depositing a dielectric layer on a substrate, depositing a metal-containing layer on the dielectric layer, and exposing the gate electrode layer to low-energy excited dopant species to incorporate a dopant into the gate stack and tune the workfunction of the gate stack. The first two steps frequently include the use of gaseous reactants that are difficult to evacuate from a processing system following a gas exposure. The use of a separate processing system 960 to incorporate the dopant into the gate stack allows for maintaining a well-defined and repeatable process environment during plasma processing of the gate stack.

It should be understood that various modifications and variations of the present invention may be employed in practicing the invention. It is therefore to be understood that, within the scope of the appended claims, the invention may be practiced otherwise than as specifically described herein.

What is claimed is:

1. A method of treating a gate stack of a semiconductor device, comprising:
   providing a substrate containing a gate stack having a dielectric layer formed on the substrate and a metal-containing gate electrode layer formed on the dielectric layer;
   forming, by a slot plane antenna (SPA) plasma source, low-energy excited dopant species from a process gas in a plasma; and
   exposing the gate stack to the excited dopant species to incorporate a dopant into the gate stack.

2. The method according to claim 1, wherein the low-energy excited dopant species comprise radicals, ions, or both.

3. The method according to claim 1, wherein the dielectric layer comprises $SiO_2$, SiON, or a high-k layer, or a combination of two or more thereof.

4. The method according to claim 3, wherein the high-k dielectric layer comprises $Ta_2O_5$, $TiO_2$, $ZrO_2$, $Al_2O_3$, $Y_2O_3$, $HfSiO_x$, $HfO_2$, $ZrO_2$, ZrSiOx, $TaSiO_x$, $SrO_x$, $SrSiO_x$, $LaO_x$, $LaSiO_x$, $YO_x$, or $YSiO_x$, or combinations of two or more thereof.

5. The method according to claim 1, wherein the metal-containing gate electrode layer comprises W, WN, Al, Mo, Ta, TaN, TaSiN, HfN, HfSiN, Ti, TiN, TiSiN, Mo, MoN, Re, or Ru.

6. The method according to claim 1, further comprising incorporating the dopant into the gate electrode layer, the dielectric layer, or both.

7. The method according to claim 1, wherein the forming comprises providing a process gas comprising a nitrogen-containing gas, a phosphor-containing gas, an arsenic-containing gas, a carbon-containing gas, a silicon-containing gas, a germanium-containing gas, a boron-containing gas, an antimony-containing gas, titanium-containing gas, a tantalum-containing gas, or an aluminum-containing gas, or a combination of two or more thereof.

8. The method according to claim 1, wherein the forming comprises providing a process gas comprising $NH_3$, $N_2$, $PH_3$, $AsH_3$, $SbH_3$, $CH_4$, $SiH_4$, $Si_2H_6$, $B_2H_6$, $GeH_4$, $TiCl_4$, $TaCl_5$, or $Al_2Cl_6$, or a combination of two or more thereof.

9. The method according to claim 1, wherein the dopant comprises N, P, As, Sb, C, Si, B, Ge, Ti, Ta, or Al, or a combination of two or more thereof.

10. The method according to claim 1, wherein the dopant comprises a p-type dopant or a n-type dopant.

11. The method according to claim 1, wherein forming comprises providing a process gas comprising a noble gas.

12. The method according to claim 1, wherein the excited dopant species have kinetic energies less than about 1000 eV.

13. The method according to claim 1, wherein the excited dopant species have kinetic energies less than about 100 eV.

14. The method according to claim 1, wherein the excited dopant species have kinetic energies less than about 2 eV.

15. The method according to claim 1, wherein the exposing is carried out by maintaining a process chamber pressure between about 1 mTorr and about 3,000 mTorr.

16. The method according to claim 1, wherein the exposing further comprises maintaining the substrate at a temperature between about 0° C. and about 1000° C.

17. The method according to claim 1, further comprising:
   annealing the gate stack following the exposure to excited dopant species, wherein the gate stack is maintained at a temperature between about 700° C. and about 1000° C. during the annealing.

18. The method according to claim 1, wherein the exposing further comprises controlling the amount of the dopant incorporated into each layer of the gate stack, thereby controlling the work function of the gate stack.

19. The method according to claim 1, wherein the gate stack further comprises a surface interface layer located between the dielectric layer and the substrate.

20. The method according to claim 1, wherein the exposing is performed in a plasma processing system operatively coupled to a first processing system configured for depositing the dielectric layer on the substrate and to a second processing system configured for depositing the metal-containing gate electrode layer on the dielectric layer.

21. The method of claim 1, further comprising incorporating the dopant into only a sublayer of the gate electrode layer.

22. The method of claim 1, further comprising incorporating the dopant into both the gate electrode layer and the dielectric layer.

23. The method of claim 1, wherein said forming comprises forming a plasma having an electron temperature of less than about 1.5 eV and a plasma density of greater than $1 \times 10^{12}/cm^3$.

24. The method of claim 1, further comprising providing said substrate on a substrate holder, the substrate holder not having a bias provided thereon.

25. The method of claim 1, wherein said exposing comprises exposing the gate stack to non-ionized excited dopant species.

* * * * *